United States Patent
Wong et al.

(10) Patent No.: US 9,184,500 B2
(45) Date of Patent: Nov. 10, 2015

(54) COMMUNICATION DEVICE AND ANTENNA ELEMENT THEREIN

(71) Applicant: Acer Incorporated, New Taipei (TW)

(72) Inventors: Kin-Lu Wong, New Taipei (TW); Huan-Jyun Jiang, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 91 days.

(21) Appl. No.: 14/181,994

(22) Filed: Feb. 17, 2014

(65) Prior Publication Data

US 2015/0155627 A1 Jun. 4, 2015

(30) Foreign Application Priority Data

Dec. 4, 2013 (TW) .............................. 102144361 A

(51) Int. Cl.
| | |
|---|---|
| *H01Q 9/00* | (2006.01) |
| *H01Q 5/00* | (2015.01) |
| *H01Q 9/04* | (2006.01) |
| H01L 35/00 | (2006.01) |
| H01Q 1/32 | (2006.01) |
| H01Q 13/10 | (2006.01) |
| H01Q 1/24 | (2006.01) |

(52) U.S. Cl.
CPC ............. *H01Q 5/0034* (2013.01); *H01Q 9/045* (2013.01); *H01Q 9/0414* (2013.01); *H01Q 9/0421* (2013.01); *H01L 35/00* (2013.01); *H01Q 1/24* (2013.01); *H01Q 1/32* (2013.01); *H01Q 9/00* (2013.01); *H01Q 13/10* (2013.01)

(58) Field of Classification Search
CPC ......... H01Q 13/18; H01Q 9/30; H01Q 9/145; H01Q 1/243; H01Q 3/44; H01Q 1/1271; H01Q 13/10
USPC ......... 343/749, 746, 745, 702, 700, 767, 713, 343/770
See application file for complete search history.

(56) References Cited

U.S. PATENT DOCUMENTS

2009/0174607 A1* 7/2009 Yan et al. ............... 343/700 MS

* cited by examiner

*Primary Examiner* — Joseph Lauture
(74) *Attorney, Agent, or Firm* — McClure, Qualey & Rodack, LLP

(57) ABSTRACT

A communication device including a ground element and an antenna element is provided. The antenna element is adjacent to an edge of the ground element. The antenna element has a projection on the edge of the ground element. The antenna element includes a radiation element, a feeding element, and a shorting element. The radiation element has a first end and a second end, and the second end is open. The radiation element has plural bends such that the second end is adjacent to the first end. One end of the feeding element is coupled through a capacitive element to a connection point on the radiation element, and the connection point is adjacent to or at the first end. Another end of the feeding element is coupled to a signal source. The feeding element includes a first segment which is substantially parallel to the edge of the ground element.

10 Claims, 5 Drawing Sheets

COMMUNICATION DEVICE AND ANTENNA ELEMENT THEREIN

CROSS REFERENCE TO RELATED APPLICATIONS

This Application claims priority of Taiwan Patent Application No. 102144361 filed on Dec. 4, 2013, the entirety of which is incorporated by reference herein.

BACKGROUND OF THE INVENTION

1. Field of the Invention

The disclosure generally relates to a communication device, and more particularly, relates to a communication device and a small-size multi-band inverted-F antenna element therein.

2. Description of the Related Art

With the rapid development of wireless communication technologies, a variety of wireless communication products are continuously being promoted and innovated. To satisfy user demand for multimedia applications, mobile communication devices require higher data-transmission speeds and larger amounts of data transfer. However, since the design of current mobile communication devices has being becoming lighter and thinner, the clearance region of antenna elements is relatively limited. Therefore, it is a critical challenge for antenna designers to design a planar, multi-band, and small-size antenna element.

BRIEF SUMMARY OF THE INVENTION

The communication device of the invention mainly includes an inverted-F antenna element with a single branch. The antenna element can have a small-size planar structure and generate at least two wide bands to cover LTE/WWAN (Long Term Evolution/Wireless Wide Area Network) bands by appropriately designing a radiation element, a feeding element, and a shorting element of the antenna element.

In a preferred embodiment, the invention provides a communication device, comprising: a ground element; and an antenna element, disposed adjacent to an edge of the ground element, wherein the antenna element has a projection on the edge, the projection has a predetermined length, and the antenna element comprises: a radiation element, having a first end and a second end, wherein the second end is open, and the radiation element has a plurality of bends, such that the second end is adjacent to the first end; a feeding element, having a third end and a fourth end, wherein the third end is coupled through a capacitive element to a connection point on the radiation element, the connection point is positioned at or adjacent to the first end, the fourth end is coupled to a signal source, the feeding element comprises a first segment, the first segment is substantially parallel to the edge, and a length of the first segment is at least 0.2 times the predetermined length; and a shorting element, having a fifth end and a sixth end, wherein the fifth end is coupled to a shorting point on the radiation element, the shorting point is adjacent to the connection point, the sixth end is coupled to the ground element, the shorting element comprises a second segment, the second segment is substantially parallel to the edge, and a length of the second segment is at least 0.2 times the predetermined length.

In some embodiments, the radiation element of the antenna element substantially has an inverted U-shape, or substantially extends to surround a rectangular region. This design leads to the low-profile and small-size characteristics of the antenna element.

In some embodiments, the antenna element at least operates in a first band and a second band, and frequencies of the first band are lower than frequencies of the second band. In some embodiments, the radiation element is excited to generate a first resonant mode in the first band, and at least a second resonant mode in the second band. The second resonant mode is a higher-order resonant mode of the radiation element. The frequency ratio of the first resonant mode to the second resonant mode may be adjusted by incorporating a first inductive element (e.g., a chip inductor) into the radiation element. In some embodiments, the first inductive element is disposed at a predetermined position on the radiation element, the spacing between the predetermined position and the first end of the radiation element is longer than 0.2 times the predetermined length, and the shorting point is positioned between the connection point and the predetermined position. In some embodiments, the predetermined position is at or adjacent to a surface current null of the second resonant mode. In such a manner, the first inductive element can decrease the frequency of the first resonant mode, but does not substantially affect the frequency of the second resonant mode. Therefore, an antenna designer can easily adjust the frequency ratio of the first resonant mode to the second resonant mode.

In some embodiments, the capacitive element disposed between the feeding element and the radiation element provides a capacitance, and it causes the excitation of the antenna element to further generate a fourth resonant mode in the first band. The fourth resonant mode can be combined with the first resonant mode to significantly increase the bandwidth of the first band.

In some embodiments, the second segment of the shorting element is disposed between the first segment of the feeding element and the radiation element. In some embodiments, the antenna element has a loop resonant path formed between the feeding element and the shorting element, and the loop resonant path is excited to generate a third resonant mode in the second band. The third resonant mode can be combined with the second resonant mode to significantly increase the bandwidth of the second band.

In some embodiments, the fourth end of the feeding element is further coupled through a second inductive element to the signal source. The second inductive element can adjust the impedance matching of the second resonant mode and the third resonant mode, and therefore the second resonant mode and the third resonant mode can be excited well.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the foregoing and other purposes, features and advantages of the invention, the embodiments and figures thereof in the invention are described in detail as follows.

Figure 1:
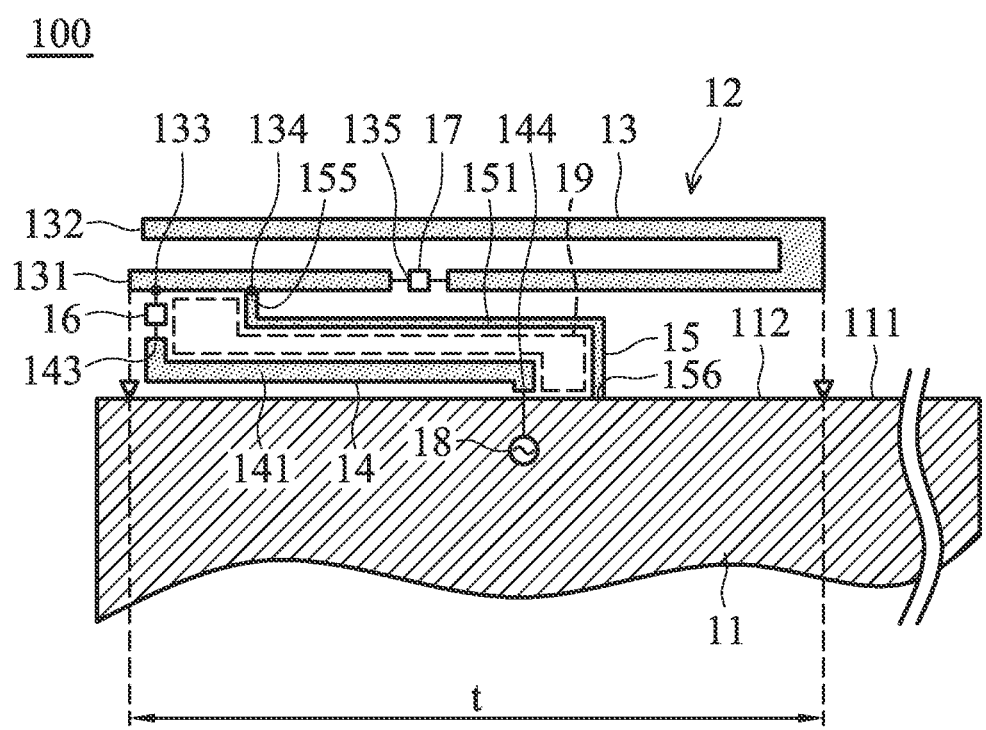
FIG. 1 is a diagram for illustrating a communication device according to a first embodiment of the invention.

FIG. 1 is a diagram for illustrating a communication device 100 according to a first embodiment of the invention. The communication device 100 may be a smartphone, a tablet computer, or a notebook computer. As shown in FIG. 1, the communication device 100 at least comprises a ground element 11 and an antenna element 12. The antenna element 12 is disposed adjacent to an edge 111 of the ground element 11. The antenna element 12 has a projection 112 on the edge 111 of the ground element 11, and the projection 112 has a predetermined length t. The antenna element 12 comprises a radiation element 13, a feeding element 14, and a shorting element 15. The radiation element 13 has a first end 131 and a second end 132. The second end 132 of the radiation element 13 is open. The radiation element 13 has a plurality of bends, and therefore the second end 132 and the first end 131 of the radiation element 13 are adjacent to each other. The feeding element 14 has a third end 143 and a fourth end 144. The third end 143 of the feeding element 14 is coupled through a capacitive element 16 to a connection point 133 on the radiation element 13. The connection point 133 is adjacent to the first end 131 of the radiation element 13. The fourth end 144 of the feeding element 14 is coupled to a signal source 18. The signal source 18 may be an RF (Radio Frequency) module for exciting the antenna element 12. The feeding element 14 comprises a first segment 141. The first segment 141 is substantially parallel to the edge 111 of the ground element 11. The length of the first segment 141 is at least 0.2 times the predetermined length t. The shorting element 15 has a fifth end 155 and a sixth end 156. The fifth end 155 of the shorting element 15 is coupled to a shorting point 134 on the radiation element 13. The shorting point 134 is adjacent to the connection point 133. The sixth end 156 of the shorting element 15 is coupled to the ground element 11. The shorting element 15 comprises a second segment 151. The second segment 151 is substantially parallel to the edge 111 of the ground element 11. The length of the second segment 151 is at least 0.2 times the predetermined length t. The second segment 151 may be disposed between the first segment 141 and the radiation element 13.

The radiation element 13 may substantially have an inverted U-shape, or may substantially extend to surround a rectangular region. The feeding element 14 may substantially have an N-shape or an inverted L-shape. The shorting element 15 may substantially have an N-shape, a meandering shape, or an inverted L-shape. The radiation element 13 may further comprise a first inductive element 17. The first inductive element 17 may be disposed at a predetermined position 135 on the radiation element 13, and may be coupled in series to other portions of the radiation element 13. The spacing between the predetermined position 135 and the first end 131 of the radiation element 13 may be longer than 0.2 times the predetermined length t. The shorting point 134 may be positioned between the connection point 133 and the predetermined position 135. The antenna element 12 may have a loop resonant path 19 which is formed between the feeding element 14 and the shorting element 15. The loop resonant path 19 may be excited to generate an additional resonant mode, and it therefore increases the operation bandwidth of the antenna element 12. Note that the communication device 100 may further comprise other components, such as a touch panel, a processor, a speaker, a battery, and a housing (not shown).

Figure 2:
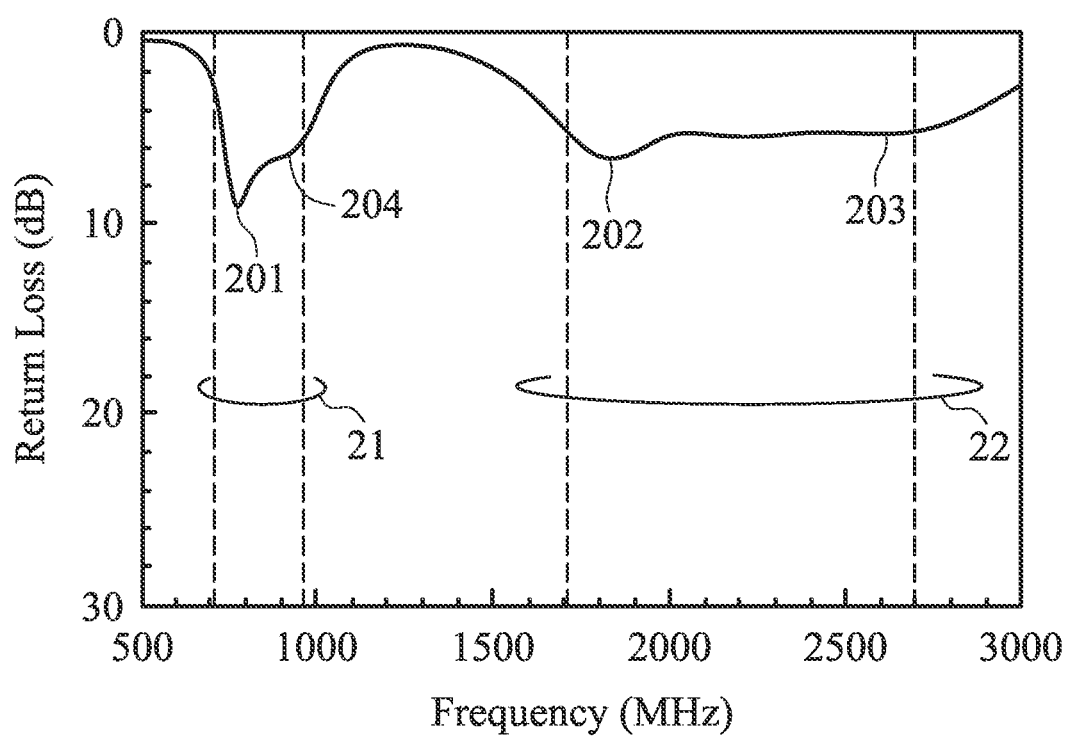
FIG. 2 is a diagram for illustrating return loss of an antenna element of a communication device according to a first embodiment of the invention.

FIG. 2 is a diagram for illustrating return loss of the antenna element 12 of the communication device 100 according to the first embodiment of the invention. In some embodiments, the element sizes and element parameters of the communication device 100 are described as follows. The ground element 11 has a length of about 200 mm and a width of about 150 mm. The size of the ground element 11 is substantially equivalent to a typical ground plane size of a 9.7" tablet computer. The antenna element 12 has a length of about 40 mm and a width of about 10 mm. The radiation element 13 has a length of about 78 mm. The feeding element 14 has a length of about 20 mm. The first segment 141 has a length of about 16 mm. The shorting element 15 has a length of about 30 mm. The second segment 151 has a length of about 22 mm. The capacitive element 16 is a chip capacitor with a capacitance of about 1 pF. The first inductive element 17 is a chip inductor with an inductance of about 10 nF. The predetermined length t is about 40 mm. The loop resonant path 19 has a length of about 65 mm. As shown in FIG. 2, the antenna element 12 can at least operate in a first band 21 and a second band 22, and the frequencies of the first band 21 are lower than the frequencies of the second band 22. More particularly, the first band 21 is formed by combining a first resonant mode 201 with a fourth resonant mode 204, and the second band 22 is formed by combining a second resonant mode 202 with a third resonant mode 203. The radiation element 13 may be excited to generate the first resonant mode 201 and the second resonant mode 202. The aforementioned predetermined position 135 of the radiation element 13 may be at or adjacent to a surface current null of the second resonant mode 202. The loop resonant path 19 may be excited to generate the third resonant mode 203, and the third resonant mode 203 may be arranged to increase the bandwidth of the second band 22. The capacitive element 16 may be excited to generate the fourth resonant mode 204, and the fourth resonant mode 204 may be arranged to increase the bandwidth of the first band 21. For example, the first band 21 may cover LTE700/GSM850/900 bands (e.g., from about 700 MHz to about 960 MHz), and the second band 22 may cover GSM1800/1900/UMTS/LTE2300/2500 bands (e.g., from about 1710 MHz to about 2690 MHz).

Figure 3:
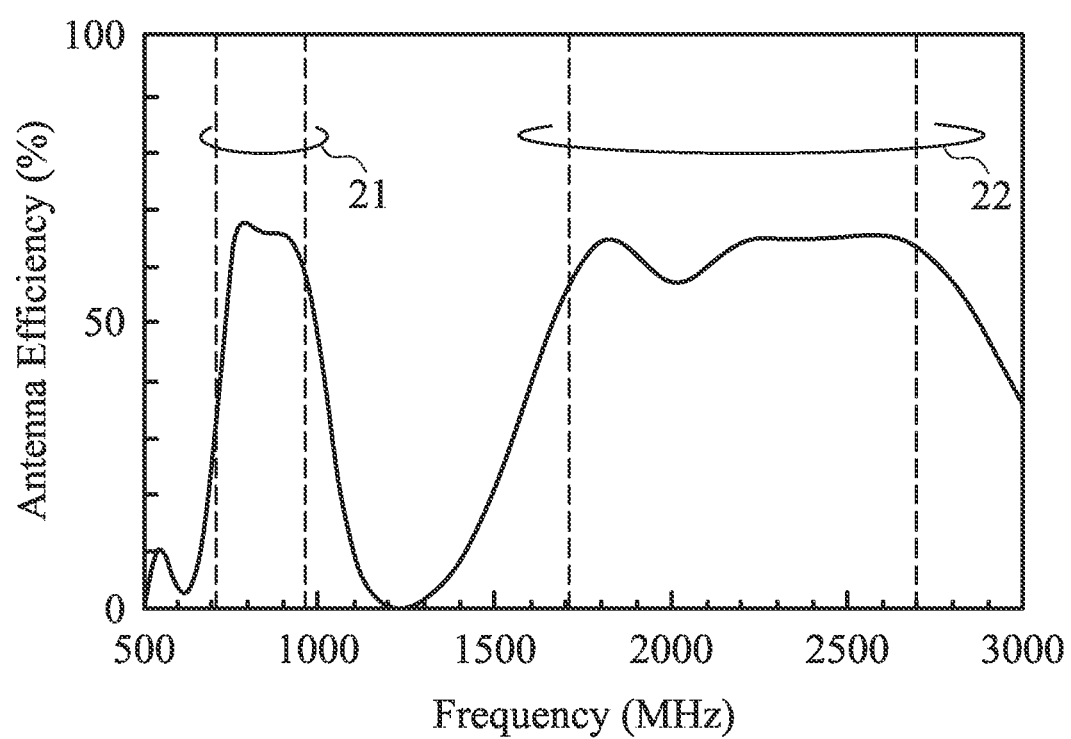
FIG. 3 is a diagram for illustrating antenna efficiency of an antenna element of a communication device according to a first embodiment of the invention.

FIG. 3 is a diagram for illustrating antenna efficiency of the antenna element 12 of the communication device 100 according to the first embodiment of the invention. It is understood that the aforementioned antenna efficiency is the radiation efficiency including the return loss. According to the measurement result of FIG. 3, the antenna efficiency of the antenna element 12 which operates in the first bands 21 (e.g., from about 700 MHz to about 960 MHz) is from about 50% to about 68%, and the antenna efficiency of the antenna element 12 which operates in the second bands 22 (e.g., from about 1710 MHz to about 2690 MHz) is from about 55% to about 65%. The above antenna efficiency can meet the requirements of practical applications of mobile communication devices.

Figure 4:
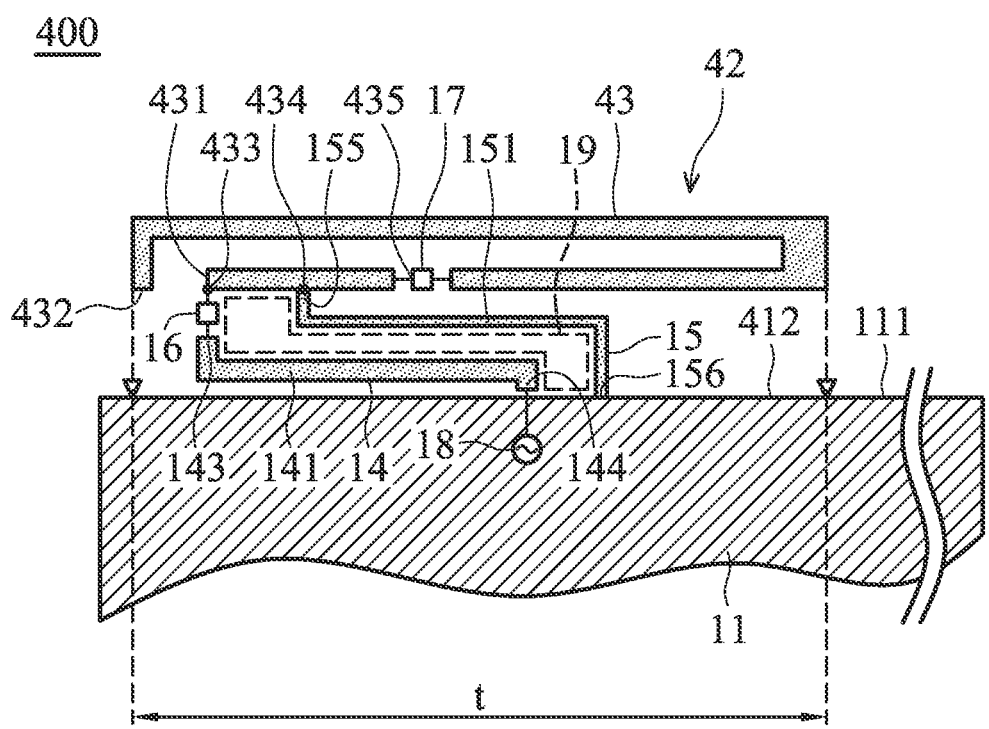
FIG. 4 is a diagram for illustrating a communication device according to a second embodiment of the invention.

FIG. 4 is a diagram for illustrating a communication device 400 according to a second embodiment of the invention. FIG. 4 is similar to FIG. 1. In an antenna element 42 of the second embodiment, the third end 143 of the feeding element 14 is coupled through the capacitive element 16 to a connection point 433 on a radiation element 43, and the connection point 433 is positioned exactly at a first end 431 of the radiation element 43. Since the radiation element 43 has a plurality of bends, the first end 431 and a second end 432 of the radiation element 43 are adjacent to each other. The radiation element 43 substantially extends to surround a rectangular region, and the second end 432 of the radiation element 43 substantially extends parallel to the edge 111 of the ground element 11. Other features of the second embodiment are similar to those of the first embodiment. Therefore, the two embodiments can achieve similar performance.

Figure 5:
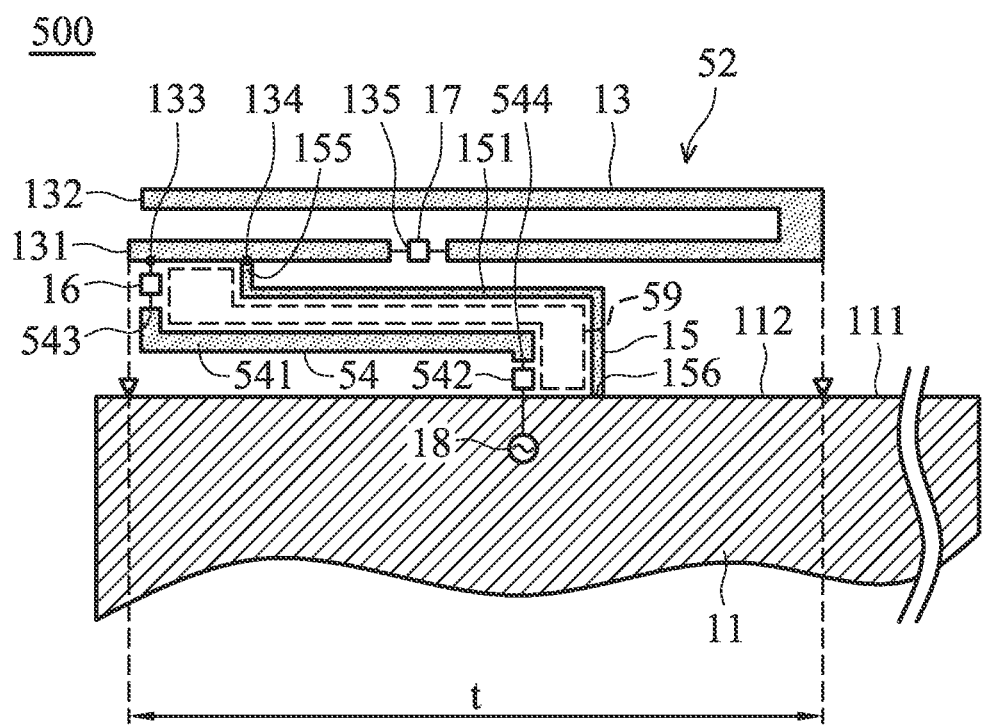
FIG. 5 is a diagram for illustrating a communication device according to a third embodiment of the invention.

FIG. 5 is a diagram for illustrating a communication device 500 according to a third embodiment of the invention. FIG. 5 is similar to FIG. 1. In an antenna element 52 of the third embodiment, a fourth end 544 of a feeding element 54 is further coupled through a second inductive element 542 to the signal source 18. The second inductive element 542 may be a chip inductor. The second inductive element 542 may be arranged to adjust the impedance matching of an additional resonant mode which is generated by exciting a loop resonant path 59. Other features of the third embodiment are similar to those of the first embodiment. Therefore, the two embodiments can achieve similar performance.

Note that the above element sizes, element shapes, and frequency ranges are not limitations of the invention. An antenna designer can fine tune these settings or values according to different requirements. It is understood that the communication device and the antenna structure of the invention are not limited to the configurations of FIGS. 1-5. The invention may merely include any one or more features of any one or more embodiments of FIGS. 1-5. In other words, not all of the features displayed in the figures should be implemented in the communication device and the antenna structure of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A communication device, comprising:
    a ground element; and
    an antenna element, disposed adjacent to an edge of the ground element, wherein the antenna element has a projection on the edge, the projection has a predetermined length, and the antenna element comprises:
        a radiation element, having a first end and a second end, wherein the second end is open, and the radiation element has a plurality of bends, such that the second end is adjacent to the first end;
        a feeding element, having a third end and a fourth end, wherein the third end is coupled through a capacitive element to a connection point on the radiation element, the connection point is positioned at or adjacent to the first end, the fourth end is coupled to a signal source, the feeding element comprises a first segment, the first segment is substantially parallel to the edge, and a length of the first segment is at least 0.2 times the predetermined length; and
        a shorting element, having a fifth end and a sixth end, wherein the fifth end is coupled to a shorting point on the radiation element, the shorting point is adjacent to the connection point, the sixth end is coupled to the ground element, the shorting element comprises a second segment, the second segment is substantially parallel to the edge, and a length of the second segment is at least 0.2 times the predetermined length.

2. The communication device as claimed in claim 1, wherein the radiation element further comprises a first inductive element, the first inductive element is predetermined position and the first end is longer than 0.2 times the predetermined length, and the shorting point is positioned between the connection point and the predetermined position.

3. The communication device as claimed in claim 2, wherein the antenna element at least operates in a first band and a second band, and frequencies of the first band are lower than frequencies of the second band.

4. The communication device as claimed in claim 3, wherein the radiation element is excited to generate a first resonant mode in the first band and at least a second resonant mode in the second band.

5. The communication device as claimed in claim 4, wherein the predetermined position is at or adjacent to a surface current null of the second resonant mode.

6. The communication device as claimed in claim 3, wherein the antenna element has a loop resonant path formed between the feeding element and the shorting element, the loop resonant path is excited to generate a third resonant mode in the second band, and the third resonant mode is arranged to increase bandwidth of the second band.

7. The communication device as claimed in claim 3, wherein the capacitive element causes excitation of the antenna element to further generate a fourth resonant mode in the first band, and the fourth resonant mode is arranged to increase bandwidth of the first band.

8. The communication device as claimed in claim 1, wherein the radiation element substantially has an inverted U-shape, or substantially extends to surround a rectangular region.

9. The communication device as claimed in claim 8, wherein the second segment is disposed between the first segment and the radiation element.

10. The communication device as claimed in claim 1, wherein the feeding element is further coupled through a second inductive element to the signal source.

* * * * *